United States Patent
Bongiovi et al.

(10) Patent No.: US 9,195,433 B2
(45) Date of Patent: *Nov. 24, 2015

(54) IN-LINE SIGNAL PROCESSOR

(71) Applicants: Anthony Bongiovi, Port St. Lucie, FL (US); Glenn Zelniker, Gainesville, FL (US); Joseph Butera, III, Stuart, FL (US); Phillip Fuller, New York, NY (US); Qiu Xihong, Guangzhou (CN)

(72) Inventors: Anthony Bongiovi, Port St. Lucie, FL (US); Glenn Zelniker, Gainesville, FL (US); Joseph Butera, III, Stuart, FL (US); Phillip Fuller, New York, NY (US); Qiu Xihong, Guangzhou (CN)

(73) Assignee: Bongiovi Acoustics LLC, Port St. Lucie, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/153,433

(22) Filed: Jan. 13, 2014

(65) Prior Publication Data

US 2014/0185829 A1    Jul. 3, 2014

Related U.S. Application Data

(63) Continuation-in-part of application No. 14/059,948, filed on Oct. 22, 2013, which is a continuation-in-part of application No. 12/648,007, filed on Dec. 28, 2009, now Pat. No. 8,565,449, which is a (Continued)

(51) Int. Cl.
*H03G 5/00* (2006.01)
*G06F 3/16* (2006.01)
*H03G 5/16* (2006.01)
*H03G 7/00* (2006.01)
*H03G 9/00* (2006.01)
*H03G 9/02* (2006.01)

(52) U.S. Cl.
CPC ............... *G06F 3/165* (2013.01); *H03G 5/165* (2013.01); *H03G 7/007* (2013.01); *H03G 9/005* (2013.01); *H03G 9/025* (2013.01)

(58) Field of Classification Search
CPC .................................. H03G 9/00; H03G 5/00
USPC .............................................. 381/103, 98–99
See application file for complete search history.

(56) References Cited

U.S. PATENT DOCUMENTS

| 4,162,462 A | 7/1979 | Endoh et al. |
| 4,184,047 A | 1/1980 | Langford |
| 4,218,950 A | 8/1980 | Uetrecht |

(Continued)

FOREIGN PATENT DOCUMENTS

| AU | 2005274099 | 10/2010 |
| AU | 20070325096 | 4/2012 |

(Continued)

OTHER PUBLICATIONS

NovaSound Int., http://www.novasoundint.com/new_page_t.htm, 2004.

*Primary Examiner* — Disler Paul
(74) *Attorney, Agent, or Firm* — Malloy & Malloy, P.L.

(57) ABSTRACT

The present invention provides for a communications cable for processing an input signal. Specifically, the present invention includes a communication cable having an input connector structured to receive an input signal, an audio enhancement module configured to process the input signal using a plurality of processing components in order to create an output signal, and an output connector structured to transmit the output signal.

12 Claims, 6 Drawing Sheets

Related U.S. Application Data continuation-in-part of application No. 11/947,301, filed on Nov. 29, 2007, now Pat. No. 8,160,274, which is a continuation-in-part of application No. 11/703,216, filed on Feb. 7, 2007.

(60) Provisional application No. 61/908,402, filed on Nov. 25, 2013, provisional application No. 60/861,711, filed on Nov. 30, 2006, provisional application No. 60/765,722, filed on Feb. 7, 2006.

(56) References Cited

U.S. PATENT DOCUMENTS

| | | | |
|---|---|---|---|
| 4,353,035 A | 10/1982 | Schroder | |
| 4,356,558 A | 10/1982 | Owen et al. | |
| 4,363,007 A | 12/1982 | Haramoto et al. | |
| 4,412,100 A | 10/1983 | Orban | |
| 4,517,415 A | 5/1985 | Laurence | |
| 4,538,297 A | 8/1985 | Waller | |
| 4,584,700 A | 4/1986 | Scholz | |
| 4,602,381 A | 7/1986 | Cugnini et al. | |
| 4,612,665 A | 9/1986 | Inami et al. | |
| 4,641,361 A | 2/1987 | Rosback | |
| 4,677,645 A | 6/1987 | Kaniwa et al. | |
| 4,696,044 A | 9/1987 | Waller, Jr. | |
| 4,701,953 A | 10/1987 | White | |
| 4,704,726 A | 11/1987 | Gibson | |
| 4,739,514 A | 4/1988 | Short et al. | |
| 4,815,142 A | 3/1989 | Imreh | |
| 4,856,068 A | 8/1989 | Quatieri et al. | |
| 4,887,299 A | 12/1989 | Cummins et al. | |
| 5,133,015 A | 7/1992 | Scholz | |
| 5,210,806 A | 5/1993 | Kihara et al. | |
| 5,239,997 A | 8/1993 | Guarino et al. | |
| 5,361,381 A | 11/1994 | Short | |
| 5,463,695 A | 10/1995 | Werrbach | |
| 5,465,421 A | 11/1995 | McCormick et al. | |
| 5,467,775 A | 11/1995 | Callahan et al. | |
| 5,541,866 A | 7/1996 | Sato et al. | |
| 5,572,443 A | 11/1996 | Emoto et al. | |
| 5,617,480 A | 4/1997 | Ballard et al. | |
| 5,640,685 A | 6/1997 | Komoda | |
| 5,671,287 A | 9/1997 | Gerzon | |
| 5,699,438 A | 12/1997 | Smith et al. | |
| 5,727,074 A | 3/1998 | Hildebrand | |
| 5,737,432 A | 4/1998 | Werrbach | |
| 5,832,097 A | 11/1998 | Armstrong et al. | |
| 5,848,164 A | 12/1998 | Levine | |
| 5,872,852 A | 2/1999 | Dougherty | |
| 5,990,955 A | 11/1999 | Koz | |
| 6,078,670 A | 6/2000 | Beyer | |
| 6,108,431 A | 8/2000 | Bachler | |
| 6,201,873 B1 | 3/2001 | Dal Farra | |
| 6,263,354 B1 | 7/2001 | Gandhi | |
| 6,285,767 B1 | 9/2001 | Klayman | |
| 6,292,511 B1 | 9/2001 | Goldston et al. | |
| 6,317,117 B1 | 11/2001 | Goff | |
| 6,318,797 B1 | 11/2001 | Bohm et al. | |
| 6,518,852 B1 | 2/2003 | Derrick | |
| 6,535,846 B1 | 3/2003 | Shashoua | |
| 6,661,900 B1 * | 12/2003 | Allred | H03G 5/005 333/28 R |
| 6,772,114 B1 | 8/2004 | Sluijter et al. | |
| 6,871,525 B2 | 3/2005 | Withnall et al. | |
| 6,907,391 B2 | 6/2005 | Bellora et al. | |
| 6,999,826 B1 | 2/2006 | Zhou et al. | |
| 7,006,653 B2 | 2/2006 | Guenther | |
| 7,016,746 B2 * | 3/2006 | Wiser | G11B 20/10527 381/23 |
| 7,058,463 B1 | 6/2006 | Ruha et al. | |
| 7,123,728 B2 | 10/2006 | King et al. | |
| 7,254,243 B2 | 8/2007 | Bongiovi | |
| 7,266,205 B2 | 9/2007 | Miller | |
| 7,274,795 B2 | 9/2007 | Bongiovi | |
| 7,519,189 B2 | 4/2009 | Bongiovi | |
| 7,577,263 B2 | 8/2009 | Tourwe | |
| 7,613,314 B2 | 11/2009 | Camp, Jr. | |
| 7,676,048 B2 | 3/2010 | Tsutsui | |
| 1,264,800 A1 | 7/2010 | Bongiovi | |
| 7,778,718 B2 | 8/2010 | Janke et al. | |
| 7,916,876 B1 | 3/2011 | Helsloot | |
| 1,272,765 A1 | 9/2011 | Hicks et al. | |
| 8,068,621 B2 | 11/2011 | Okabayashi et al. | |
| 8,160,274 B2 | 4/2012 | Bongiovi | |
| 8,175,287 B2 | 5/2012 | Ueno et al. | |
| 8,229,136 B2 | 7/2012 | Bongiovi | |
| 8,284,955 B2 | 10/2012 | Bongiovi et al. | |
| 8,462,963 B2 | 6/2013 | Bongiovi | |
| 8,472,642 B2 | 6/2013 | Bongiovi | |
| 8,565,449 B2 | 10/2013 | Bongiovi | |
| 8,705,765 B2 | 4/2014 | Bongiovi | |
| 2001/0008535 A1 | 7/2001 | Lanigan | |
| 2001/0043704 A1 | 11/2001 | Schwartz | |
| 2002/0057808 A1 | 5/2002 | Goldstein | |
| 2003/0023429 A1 | 1/2003 | Claesson | |
| 2003/0035555 A1 * | 2/2003 | King | H03G 5/005 381/103 |
| 2003/0112088 A1 | 6/2003 | Bizjak | |
| 2003/0138117 A1 * | 7/2003 | Goff | 381/103 |
| 2003/0179891 A1 * | 9/2003 | Rabinowitz et al. | 381/103 |
| 2003/0216907 A1 | 11/2003 | Thomas | |
| 2004/0022400 A1 | 2/2004 | Magrath | |
| 2004/0044804 A1 | 3/2004 | Mac Farlane | |
| 2004/0086144 A1 | 5/2004 | Kallen | |
| 2004/0138769 A1 | 7/2004 | Akiho | |
| 2004/0146170 A1 | 7/2004 | Zint | |
| 2005/0090295 A1 | 4/2005 | Ali et al. | |
| 2005/0129248 A1 | 6/2005 | Kraemer et al. | |
| 2005/0175185 A1 | 8/2005 | Korner | |
| 2005/0201572 A1 | 9/2005 | Lindahl et al. | |
| 2005/0249272 A1 | 11/2005 | Kirkeby et al. | |
| 2005/0254564 A1 | 11/2005 | Tsutsui | |
| 2006/0034467 A1 | 2/2006 | Sleboda et al. | |
| 2006/0064301 A1 | 3/2006 | Aguilar et al. | |
| 2006/0098827 A1 | 5/2006 | Paddock et al. | |
| 2006/0126851 A1 | 6/2006 | Yuen et al. | |
| 2006/0126865 A1 | 6/2006 | Blamey et al. | |
| 2006/0140319 A1 | 6/2006 | Eldredge et al. | |
| 2006/0291670 A1 | 12/2006 | King et al. | |
| 2007/0010132 A1 | 1/2007 | Nelson | |
| 2007/0177459 A1 | 8/2007 | Behn | |
| 2007/0206643 A1 | 9/2007 | Egan | |
| 2007/0223713 A1 | 9/2007 | Gunness | |
| 2007/0223717 A1 | 9/2007 | Boersma | |
| 2007/0253577 A1 | 11/2007 | Yen et al. | |
| 2008/0031462 A1 | 2/2008 | Walsh et al. | |
| 2008/0040116 A1 | 2/2008 | Cronin | |
| 2008/0069385 A1 | 3/2008 | Revit | |
| 2008/0112576 A1 | 5/2008 | Bongiovi | |
| 2008/0123870 A1 | 5/2008 | Stark | |
| 2008/0123873 A1 | 5/2008 | Bjorn-Josefsen et al. | |
| 2008/0137881 A1 | 6/2008 | Bongiovi | |
| 2008/0165989 A1 | 7/2008 | Seil et al. | |
| 2008/0181424 A1 | 7/2008 | Schulein et al. | |
| 2008/0219459 A1 | 9/2008 | Bongiovi et al. | |
| 2009/0022328 A1 | 1/2009 | Neugebauer et al. | |
| 2009/0054109 A1 | 2/2009 | Hunt | |
| 2009/0062946 A1 | 3/2009 | Bongiovi et al. | |
| 2009/0086996 A1 | 4/2009 | Bongiovi et al. | |
| 2009/0290725 A1 | 11/2009 | Huang | |
| 2009/0296959 A1 | 12/2009 | Bongiovi | |
| 2010/0303278 A1 | 12/2010 | Sahyoun | |
| 2011/0087346 A1 | 4/2011 | Larsen et al. | |
| 2011/0194712 A1 | 8/2011 | Potard | |
| 2012/0014553 A1 | 1/2012 | Bonanno | |
| 2012/0099071 A1 | 4/2012 | Gotoh et al. | |
| 2012/0170759 A1 | 7/2012 | Yuen et al. | |
| 2012/0213375 A1 | 8/2012 | Mahabub et al. | |
| 2012/0302920 A1 | 11/2012 | Bridger et al. | |
| 2013/0121507 A1 | 5/2013 | Bongiovi et al. | |
| 2013/0162908 A1 | 6/2013 | Son et al. | |
| 2013/0227631 A1 | 8/2013 | Sharma et al. | |
| 2013/0242191 A1 | 9/2013 | Leyendecker | |

(56) References Cited

U.S. PATENT DOCUMENTS

| | | |
|---|---|---|
| 2014/0100682 A1 | 4/2014 | Bongiovi |
| 2014/0185829 A1 | 7/2014 | Bongiovi |
| 2014/0379355 A1 | 12/2014 | Hosokawsa |

FOREIGN PATENT DOCUMENTS

| | | |
|---|---|---|
| AU | 2012202127 | 7/2014 |
| CA | 2533221 | 6/1995 |
| CA | 2576829 | 7/2014 |
| CN | 0780050323X | 5/2013 |
| CN | 203057339 | 7/2013 |
| EP | 0206746 B1 | 8/1992 |
| GB | 2003707 A | 3/1979 |
| ID | P0031074 | 6/2012 |
| IN | 260362 | 4/2014 |
| IS | 198914 | 7/2014 |
| JP | 3150910 | 6/1991 |
| JP | 7106876 | 4/1995 |
| JP | 1020040022442 | 3/2004 |
| JP | 2005500768 | 1/2005 |
| JP | 1020090101209 | 9/2009 |
| JP | 4787255 | 7/2011 |
| JP | 5048782 | 7/2012 |
| JP | 201543561 | 3/2015 |
| KR | 1020040022442 | 3/2004 |
| KR | 1020090101209 | 9/2009 |
| KR | 101503541 | 3/2015 |
| MO | J001182 | 10/2013 |
| MX | 274143 | 8/2005 |
| MX | 301172 | 11/2006 |
| MX | 315197 | 11/2013 |
| NZ | 553744 | 1/2009 |
| NZ | 574141 | 4/2010 |
| NZ | 557201 | 5/2012 |
| PH | 12009501073 | 11/2014 |
| RU | 2407142 | 12/2010 |
| RU | 2483363 | 5/2013 |
| SG | 152762 | 12/2011 |
| SG | 155213 | 2/2013 |
| SU | 1319288 | 6/1987 |
| WO | WO 9311637 | 6/1993 |
| WO | WO 9535628 | 12/1995 |
| WO | WO 9938155 | 7/1999 |
| WO | WO 0015003 | 3/2000 |
| WO | WO 2006020427 | 2/2006 |
| WO | WO 2007092420 | 8/2007 |
| WO | WO 2008067454 | 6/2008 |
| WO | WO 2009070797 | 6/2009 |
| WO | WO 2009114746 | 9/2009 |
| WO | WO 2009155057 | 12/2009 |
| WO | WO 2010027705 | 3/2010 |
| WO | WO 2010051354 | 5/2010 |
| WO | WO 2011081965 | 7/2011 |
| WO | WO 2013076223 | 5/2013 |
| WO | WO 2015061393 | 4/2015 |
| WO | WO 2015077681 | 5/2015 |

\* cited by examiner

IN-LINE SIGNAL PROCESSOR

CROSS-REFERENCE TO RELATED APPLICATIONS

This application claims priority to U.S. Provisional Application No. 61/908,402 filed on Nov. 25, 2013.

This application is also a continuation-in-part of U.S. application Ser. No. 14/059,948 filed on Oct. 22, 2013 and which is a continuation-in-part of U.S. application Ser. No. 12/648,007 filed on Dec. 28, 2009 and which matured into U.S. Pat. No. 8,565,449 on Oct. 22, 2013, which is a continuation-in-part of U.S. application Ser. No. 11/947,301 filed on Nov. 29, 2007 and which matured into U.S. Pat. No. 8,160,274 on Apr. 17, 2012, which claims priority to U.S. Provisional Application No. 60/861,711 filed Nov. 30, 2006, and is a continuation-in-part of U.S. application Ser. No. 11/703,216, filed Feb. 7, 2007, which claims priority to U.S. Provisional Application No. 60/765,722, filed Feb. 7, 2006.

Each of the above patents and applications is incorporated by reference herein in its entirety.

FIELD OF THE INVENTION

The present invention provides for an apparatus for digitally processing an audio signal. Specifically, some embodiments relate to digitally processing an input signal as part of a communications cable in order to deliver studio-quality sound across a variety of consumer electronic devices.

BACKGROUND OF THE INVENTION

Historically, studio-quality sound, which can best be described as the full reproduction of the complete range of audio frequencies that are utilized during the studio recording process, has only been able to be achieved, appropriately, in audio recording studios. Studio-quality sound is characterized by the level of clarity and brightness which is attained only when the upper-mid frequency ranges are effectively manipulated and reproduced. While the technical underpinnings of studio-quality sound can be fully appreciated only by experienced record producers, the average listener can easily hear the difference that studio-quality sound makes.

While various attempts have been made to reproduce studio-quality sound outside of the recording studio, those attempts have come at tremendous expense (usually resulting from advanced speaker design, costly hardware, and increased power amplification) and have achieved only mixed results. Furthermore, the required hardware is inconvenient, and requires additional components and setup. Thus, there is a need for a device, such as an in-line signal processor, which provides both the required hardware and software to enable the enhancement of audio signals between and across various consumer devices.

SUMMARY OF THE INVENTION

The present invention meets the existing needs described above by providing systems, methods, and apparatuses for processing an audio signal in a manner such that studio-quality sound can be reproduced across the entire spectrum of audio devices. The present invention also provides for the ability to enhance audio in real-time and tailors the enhancement to the audio signal of a given audio device or delivery system and playback environment.

The present invention may provide for a computer chip that can digitally process an audio signal in such a manner, as well as provide for audio devices that comprise such a chip or equivalent circuit combination. The present invention may also provide for computer software readable and executable by a computer to digitally process an audio signal. In the software embodiments, the present invention may utilize existing hardware and software components on computers such as PCs, Mac, and mobile devices, comprising various operating systems such as Android, iOS, and Windows.

Accordingly, in initially broad terms, an audio input signal is first filtered with a high pass filter. The high pass filter, in at least one embodiment, is configured to remove ultra-low frequency content from the input audio signal resulting in the generation of a high pass signal.

The high pass signal from the high pass filter is then filtered through a first filter module to create a first filtered signal. The first filter module is configured to selectively boost and/or attenuate the gain of select frequency ranges in an audio signal, such as the high pass signal. In at least one embodiment, the first filter module boosts frequencies above a first frequency, and attenuates frequencies below a first frequency.

The first filtered signal from the first filter module is then modulated with a first compressor to create a modulated signal. The first compressor is configured for the dynamic range compression of a signal, such as the first filtered signal. Because the first filtered signal boosted higher frequencies and attenuated lower frequencies, the first compressor may, in at least one embodiment, be configured to trigger and adjust the higher frequency material, while remaining relatively insensitive to lower frequency material.

The modulated signal from the first compressor is then filtered through a second filter module to create a second filtered signal. The second filter module is configured to selectively boost and/or attenuate the gain of select frequency ranges in an audio signal, such as the modulated signal. In at least one embodiment, the second filter module is configured to be of least partially a inverse relation relative to the first filter module. For example, if the first filter module boosted content above a first frequency by +X dB and attenuated content below a first frequency by -Y dB, the second filter module may then attenuate the content above the first frequency by -X dB, and boost the content below the first frequency by +Y dB. In other words, the purpose of the second filter module in one embodiment may be to "undo" the gain adjustment that was applied by the first filter module.

The second filtered signal from the second filter module is then processed with a first processing module to create a processed signal. In at least one embodiment, the first processing module may comprise a peak/dip module. In other embodiments, the first processing module may comprise both a peak/dip module and a first gain element. The first gain element may be configured to adjust the gain of the signal, such as the second filtered signal. The peak/dip module may be configured to shape the signal, such as to increase or decrease overshoots or undershoots in the signal.

The processed signal from the first processing module is then split with a band splitter into a low band signal, a mid band signal and a high band signal. In at least one embodiment, each band may comprise the output of a fourth order section, which may be realized as the cascade of second order biquad filters.

The low band signal is modulated with a low band compressor to create a modulated low band signal, and the high band signal is modulated with a high band compressor to create a modulated high band signal. The low band compressor and high band compressor are each configured to dynamically adjust the gain of a signal. Each of the low band compressor and high band compressor may be computationally and/or configured identically as the first compressor.

The modulated low band signal, the mid band signal, and the modulated high band signal are then processed with a second processing module. The second processing module may comprise a summing module configured to combine the signals. The summing module in at least one embodiment may individually alter the gain of each of the modulated low band, mid band, and modulated high band signals. The second processing module may further comprise a second gain element. The second gain element may adjust the gain of the combined signal in order to create an output signal.

One further embodiment of the present invention is directed to an in-line processor attached to or embedded within a communications cable. Such a cable comprises an input connector, an audio enhancement module, and an output connector. Accordingly, the audio enhancement module may comprise a plurality of processing components structured and/or configured to process an input signal, such as the one or more processing components recited in this application, or the one or more processing components recited in one or more of the applications and/or patents cross-referenced and incorporated by reference above. In at least one embodiment, a profile module may allow a user to select between predetermined audio enhancement scheme and/or parameters thereof. The audio enhancement module will process the input signal in accordance to a predetermined audio enhancement scheme in order to create an output signal, which is then transmitted by the output connector.

These and other objects, features and advantages of the present invention will become clearer when the drawings as well as the detailed description are taken into consideration.

BRIEF DESCRIPTION OF THE DRAWINGS

For a fuller understanding of the nature of the present invention, reference should be had to the following detailed description taken in connection with the accompanying drawings in which.

Like reference numerals refer to like parts throughout the several views of the drawings.

DETAILED DESCRIPTION OF THE EMBODIMENT

As illustrated by the accompanying drawings, the present invention is directed to systems, methods, and apparatuses for digitally processing an audio signal. Specifically, some embodiments relate to digitally processing an audio signal in order to deliver studio-quality sound in a variety of different consumer electronic devices.

Figure 1:
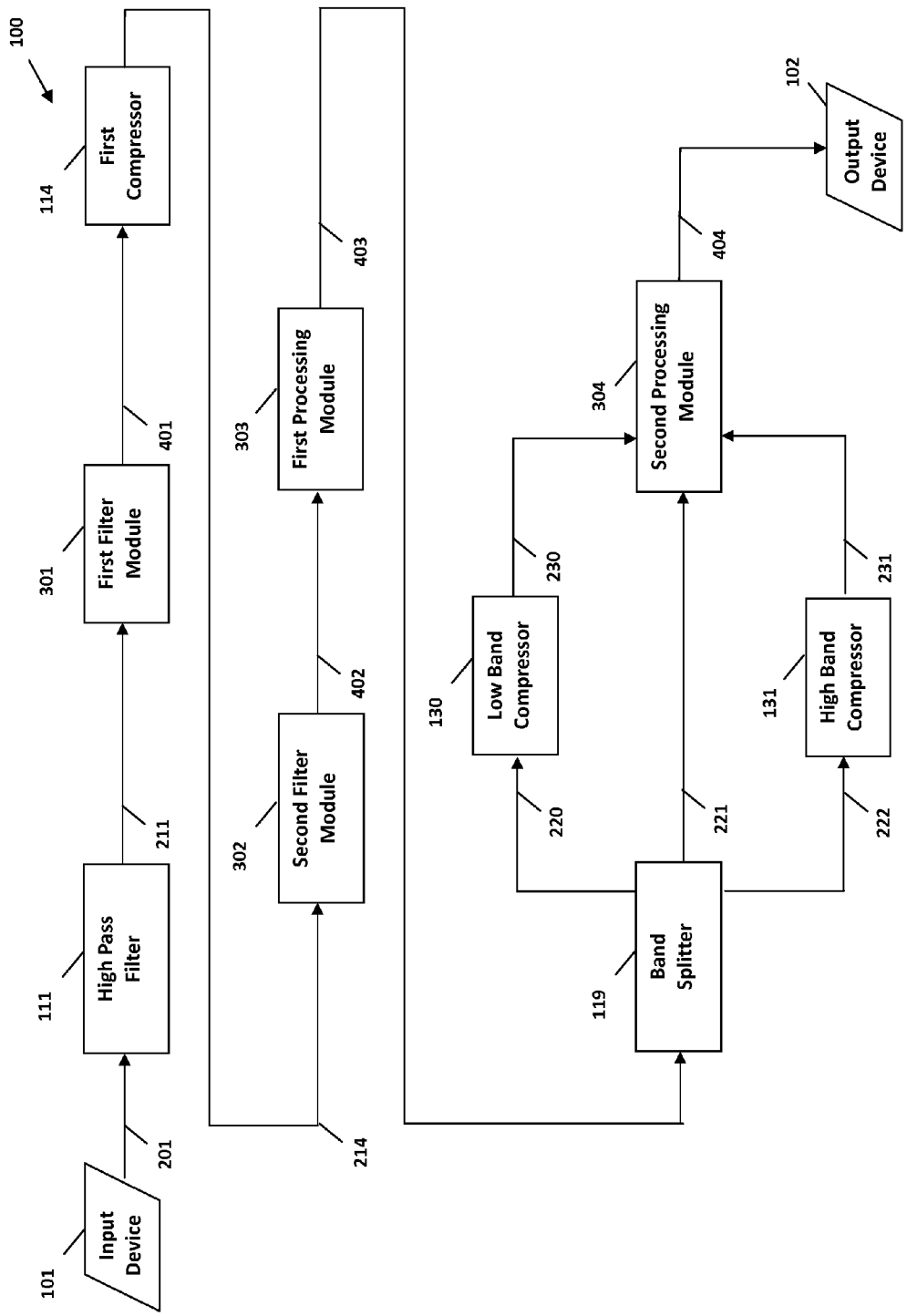
FIG. 1 illustrates a schematic of one embodiment of the present invention directed to a system for digitally processing an audio signal.
Figure 2:
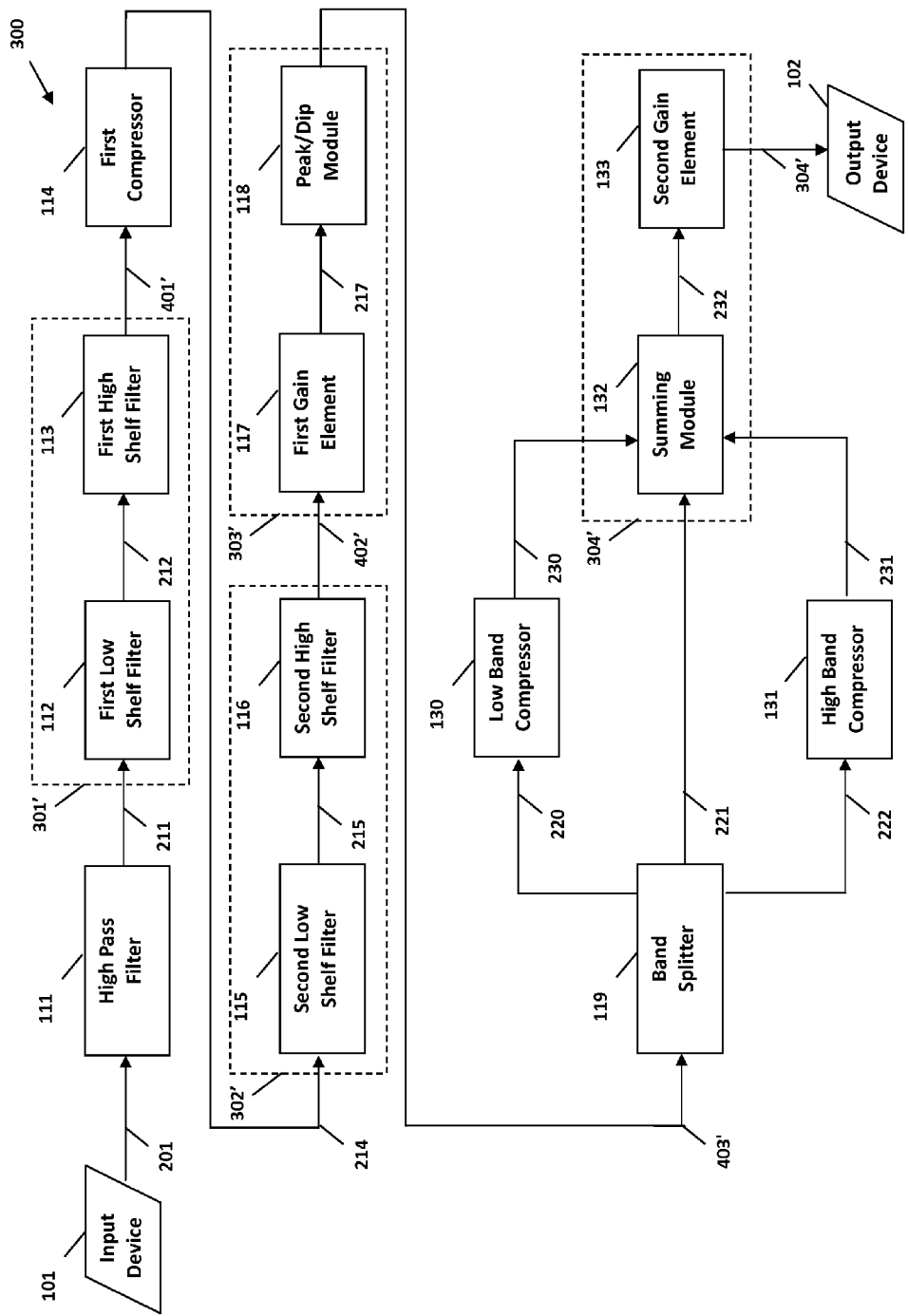
FIG. 2 illustrates a schematic of another embodiment of the present invention directed to a system for digitally processing an audio signal.

As schematically represented, FIG. 1 illustrates at least one preferred embodiment of a system 100 for digitally processing an audio signal, and FIG. 2 provides examples of several subcomponents and combinations of subcomponents of the modules of FIG. 1. Accordingly, and in these embodiments, the systems 100 and 300 generally comprise an input device 101, a high pass filter 111, a first filter module 301, a first compressor 114, a second filter module 302, a first processing module 303, a band splitter 119, a low band compressor 130, a high band compressor 131, a second processing module 304, and an output device 102.

The input device 101 is at least partially structured or configured to transmit an input audio signal 201 into the system 100 of the present invention, and in at least one embodiment into the high pass filter 111. The input audio signal 201 may comprise the full audible range, or portions of the audible range. The input audio signal 201 may comprise a stereo audio signal. The input device 101 may comprise at least portions of an audio device capable of audio playback. The input device 101 for instance, may comprise a stereo system, a portable music player, a mobile device, a computer, a sound or audio card, or any other device or combination of electronic circuits suitable for audio playback.

The high pass filter 111 is configured to pass through high frequencies of an audio signal, such as the input signal 201, while attenuating lower frequencies, based on a predetermined frequency. In other words, the frequencies above the predetermined frequency may be transmitted to the first filter module 301 in accordance with the present invention. In at least one embodiment, ultra-low frequency content is removed from the input audio signal, where the predetermined frequency may be selected from a range between 300 Hz and 3 kHz. The predetermined frequency however, may vary depending on the source signal, and vary in other embodiments to comprise any frequency selected from the full audible range of frequencies between 20 Hz to 20 kHz. The predetermined frequency may be tunable by a user, or alternatively be statically set. The high pass filter 111 may further comprise any circuits or combinations thereof structured to pass through high frequencies above a predetermined frequency, and attenuate or filter out the lower frequencies.

The first filter module 301 is configured to selectively boost or attenuate the gain of select frequency ranges within an audio signal, such as the high pass signal 211. For example, and in at least one embodiment, frequencies below a first frequency may be adjusted by ±X dB, while frequencies above a first frequency may be adjusted by ±Y dB. In other embodiments, a plurality of frequencies may be used to selectively adjust the gain of various frequency ranges within an audio signal. In at least one embodiment, the first filter module 301 may be implemented with a first low shelf filter 112 and a first high shelf filter 113, as illustrated in FIG. 1. The first low shelf filter 112 and first high shelf filter 113 may both be second-order filters. In at least one embodiment, the first low shelf filter 112 attenuates content below a first frequency, and the first high shelf filter 112 boosts content above a first frequency. In other embodiments, the frequency used for the first low shelf filter 112 and first high shelf filter 112 may comprise two different frequencies. The frequencies may be static or adjustable. Similarly, the gain adjustment (boost or attenuation) may be static or adjustable.

The first compressor 114 is configured to modulate a signal, such as the first filtered signal 401. The first compressor 112 may comprise an automatic gain controller. The first compressor 112 may comprise standard dynamic range compression controls such as threshold, ratio, attack and release. Threshold allows the first compressor 112 to reduce the level of the filtered signal 211 if its amplitude exceeds a certain threshold. Ratio allows the first compressor 112 to reduce the gain as determined by a ratio. Attack and release determines how quickly the first compressor 112 acts. The attack phase is the period when the first compressor 112 is decreasing gain to reach the level that is determined by the threshold. The release phase is the period that the first compressor 112 is increasing gain to the level determined by the ratio. The first compressor 112 may also feature soft and hard knees to control the bend in the response curve of the output or modulated signal 212, and other dynamic range compression controls appropriate for the dynamic compression of an audio signal. The first compressor 112 may further comprise any device or combination of circuits that is structured and configured for dynamic range compression.

The second filter module 302 is configured to selectively boost or attenuate the gain of select frequency ranges within an audio signal, such as the modulated signal 214. In at least one embodiment, the second filter module 302 is of the same configuration as the first filter module 301. Specifically, the second filter module 302 may comprise a second low shelf filter 115 and a second high shelf filter 116. The second filter module 302 may be configured in at least a partially inverse configuration to the first filter module 301. For instance, the second filter module may use the same frequency, for instance the first frequency, as the first filter module. Further, the second filter module may adjust the gain inversely to the gain or attenuation of the first filter module, of content above the first frequency. Similarly second filter module may also adjust the gain inversely to the gain or attenuation of the of the first filter module, of content below the first frequency. In other words, the purpose of the second filter module in one embodiment may be to "undo" the gain adjustment that was applied by the first filter module.

The first processing module 303 is configured to process a signal, such as the second filtered signal 402. In at least one embodiment, the first processing module 303 may comprise a peak/dip module, such as 118 represented in FIG. 2. In other embodiments, the first processing module 303 may comprise a first gain element 117. In various embodiments, the processing module 303 may comprise both a first gain element 117 and a peak/dip module 118 for the processing of a signal. The first gain element 117, in at least one embodiment, may be configured to adjust the level of a signal by a static amount. The first gain element 17 may comprise an amplifier or a multiplier circuit. In other embodiments, dynamic gain elements may be used. The peak/dip module 118 is configured to shape the desired output spectrum, such as to increase or decrease overshoots or undershoots in the signal. In some embodiments, the peak/dip module may further be configured to adjust the slope of a signal, for instance for a gradual scope that gives a smoother response, or alternatively provide for a steeper slope for more sudden sounds. In at least one embodiment, the peak/dip module 118 comprises a bank of ten cascaded peak/dipping filters. The bank of ten cascaded peaking/dipping filters may further be second-order filters. In at least one embodiment, the peak/dip module 118 may comprise an equalizer, such as parametric or graphic equalizers.

The band splitter 119 is configured to split a signal, such as the processed signal 403. In at least one embodiment, the signal is split into a low band signal 220, a mid band signal 221, and a high band signal 222. Each band may be the output of a fourth order section, which may be further realized as the cascade of second order biquad filters. In other embodiments, the band splitter may comprise any combination of circuits appropriate for splitting a signal into three frequency bands. The low, mid, and high bands may be predetermined ranges, or may be dynamically determined based on the frequency itself, i.e. a signal may be split into three even frequency bands, or by percentage. The different bands may further be defined or configured by a user and/or control mechanism.

A low band compressor 130 is configured to modulate the low band signal 220, and a high band compressor 131 is configured to modulate the high band signal 222. In at least one embodiment, each of the low band compressor 130 and high band compressor 131 may be the same as the first compressor 114. Accordingly, each of the low band compressor 130 and high band compressor 131 may each be configured to modulate a signal. Each of the low band and high band compressors, 130 and 131 respectively, may comprise an automatic gain controller, or any combination of circuits appropriate for the dynamic range compression of an audio signal.

A second processing module 304 is configured to process at least one signal, such as the modulated low band signal 230, the mid band signal 221, and the modulated high band signal 231. Accordingly, the second processing module 304 may comprise a summing module 132 configured to combine a plurality of signals. The summing module 132 may comprise a mixer structured to combine two or more signals into a composite signal. The summing module 132 may comprise any circuits or combination thereof structured or configured to combine two or more signals. In at least one embodiment, the summing module 132 comprises individual gain controls for each of the incoming signals, such as the modulated low band signal 230, the mid band signal 221, and the modulated high band signal 231. In at least one embodiment, the second processing module 304 may further comprise a second gain element 133. The second gain element 133, in at least one embodiment, may be the same as the first gain element 117. The second gain element 133 may thus comprise an amplifier or multiplier circuit to adjust the signal, such as the combined signal, by a predetermined amount.

The output device 102 may be structured to further process the output signal 404. The output device 102 may also be structured and/or configured for playback of the output signal 404.

Figure 3:
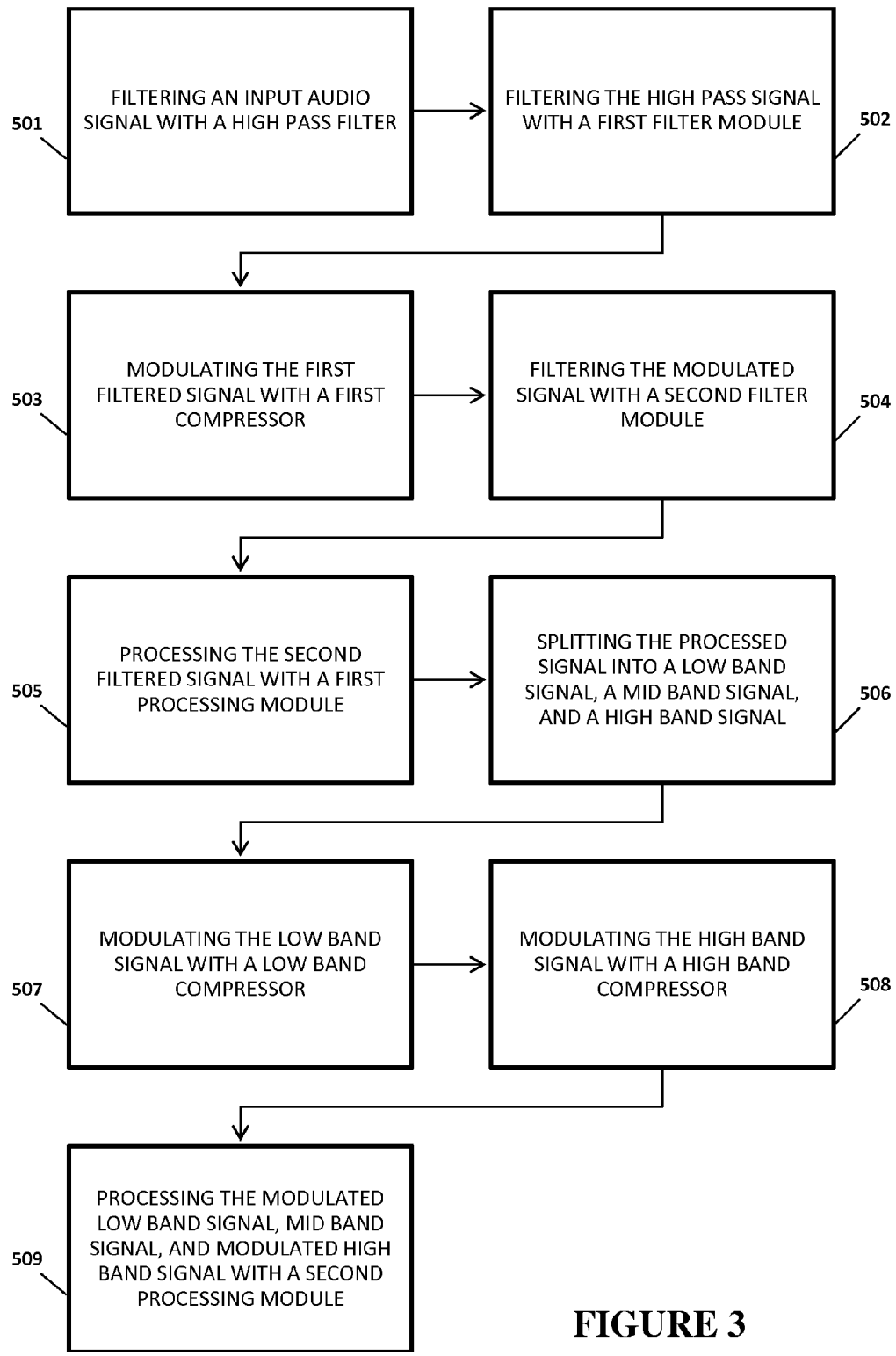
FIG. 3 illustrates a block diagram of another embodiment of the present invention directed to a method for digitally processing an audio signal.

As diagrammatically represented, FIG. 3 illustrates another embodiment directed to a method for digitally processing an audio signal, which may in at least one embodiment incorporate the components or combinations thereof from the systems 100 and/or 300 referenced above. Each step of the method in FIG. 3 as detailed below may also be in the form of a code segment directed to at least one embodiment of the present invention, which is stored on a non-transitory computer readable medium, for execution by a computer to process an input audio signal.

Accordingly, an input audio signal is first filtered, as in 501, with a high pass filter to create a high pass signal. The high pass filter is configured to pass through high frequencies of a signal, such as the input signal, while attenuating lower frequencies. In at least one embodiment, ultra-low frequency content is removed by the high-pass filter. In at least one embodiment, the high pass filter may comprise a fourth-order filter realized as the cascade of two second-order biquad sections. The reason for using a fourth order filter broken into two second order sections is that it allows the filter to retain numerical precision in the presence of finite word length effects, which can happen in both fixed and floating point implementations. An example implementation of such an embodiment may assume a form similar to the following:

Two memory locations are allocated, designated as $d(k-1)$ and $d(k-2)$, with each holding a quantity known as a state variable. For each input sample $x(k)$, a quantity $d(k)$ is calculated using the coefficients $a1$ and $a2$:

$$d(k)=x(k)-a1*d(k-1)-a2*d(k-2)$$

The output y(k) is then computed, based on coefficients b0, b1, and b2, according to:

$$y(k)=b0*d(k)+b1*d(k-1)+b2*d(k-2)$$

The above computation comprising five multiplies and four adds is appropriate for a single channel of second-order biquad section. Accordingly, because the fourth-order high pass filter is realized as a cascade of two second-order biquad sections, a single channel of fourth order input high pass filter would require ten multiples, four memory locations, and eight adds.

The high pass signal from the high pass filter is then filtered, as in 502, with a first filter module to create a first filtered signal. The first filter module is configured to selectively boost or attenuate the gain of select frequency ranges within an audio signal, such as the high pass signal. Accordingly, the first filter module may comprise a second order low shelf filter and a second order high shelf filter in at least one embodiment. In at least one embodiment, the first filter module boosts the content above a first frequency by a certain amount, and attenuates the content below a first frequency by a certain amount, before presenting the signal to a compressor or dynamic range controller. This allows the dynamic range controller to trigger and adjust higher frequency material, whereas it is relatively insensitive to lower frequency material.

The first filtered signal from the first filter module is then modulated, as in 503, with a first compressor. The first compressor may comprise an automatic or dynamic gain controller, or any circuits appropriate for the dynamic compression of an audio signal. Accordingly, the compressor may comprise standard dynamic range compression controls such as threshold, ratio, attack and release. An example implementation of the first compressor may assume a form similar to the following:

The compressor first computes an approximation of the signal level, where att represents attack time; rel represents release time; and invThr represents a precomputed threshold:

```
temp = abs(x(k))
if temp > level (k-1)
    level(k) = att * (level(k-1) – temp) + temp
else
    level = rel * (level(k-1) – temp) + temp
```

This level computation is done for each input sample. The ratio of the signal's level to invThr then determines the next step. If the ratio is less than one, the signal is passed through unaltered. If the ratio exceeds one, a table in the memory may provide a constant that's a function of both invThr and level:

```
if (level * thr < 1)
    output(k) = x(k)
else
    index = floor(level * invThr)
    if (index > 99)
        index = 99
    gainReduction = table [index]
    output(k) = gainReduction * x(k)
```

The modulated signal from the first compressor is then filtered, as in 504, with a second filter module to create a second filtered signal. The second filter module is configured to selectively boost or attenuate the gain of select frequency ranges within an audio signal, such as the modulated signal. Accordingly, the second filter module may comprise a second order low shelf filter and a second order high shelf filter in at least one embodiment. In at least one embodiment, the second filter module boosts the content above a second frequency by a certain amount, and attenuates the content below a second frequency by a certain amount. In at least one embodiment, the second filter module adjusts the content below the first specified frequency by a fixed amount, inverse to the amount that was removed by the first filter module. By way of example, if the first filter module boosted content above a first frequency by +X dB and attenuated content below a first frequency by –Y dB, the second filter module may then attenuate the content above the first frequency by –X dB, and boost the content below the first frequency by +Y dB. In other words, the purpose of the second filter module in one embodiment may be to "undo" the filtering that was applied by the first filter module.

The second filtered signal from the second filter module is then processed, as in 505, with a first processing module to create a processed signal. The first processing module may comprise a gain element configured to adjust the level of the signal. This adjustment, for instance, may be necessary because the peak-to-average ratio was modified by the first compressor. The first processing module may comprise a peak/dip module. The peak/dip module may comprise ten cascaded second-order filters in at least one embodiment. The peak/dip module may be used to shape the desired output spectrum of the signal. In at least one embodiment, the first processing module comprises only the peak/dip module. In other embodiments, the first processing module comprises a gain element followed by a peak/dip module.

The processed signal from the first processing module is then split, as in 506, with a band splitter into a low band signal, a mid band signal, and a high band signal. The band splitter may comprise any circuit or combination of circuits appropriate for splitting a signal into a plurality of signals of different frequency ranges. In at least one embodiment, the band splitter comprises a fourth-order band-splitting bank. In this embodiment, each of the low band, mid band, and high band is yielded as the output of a fourth-order section, realized as the cascade of second-order biquad filters.

The low band signal is modulated, as in 507, with a low band compressor to create a modulated low band signal. The low band compressor may be configured and/or computationally identical to the first compressor in at least one embodiment. The high band signal is modulated, as in 508, with a high band compressor to create a modulated high band signal. The high band compressor may be configured and/or computationally identical to the first compressor in at least one embodiment.

The modulated low band signal, mid band signal, and modulated high band signal are then processed, as in 509, with a second processing module. The second processing module comprises at least a summing module. The summing module is configured to combine a plurality of signals into one composite signal. In at least one embodiment, the summing module may further comprise individual gain controls for each of the incoming signals, such as the modulated low band signal, the mid band signal, and the modulated high band signal. By way of example, an output of the summing module may be calculated by:

$$out=w0*low+w1*mid+w2*high$$

The coefficients w0, w1, and w2 represent different gain adjustments. The second processing module may further comprise a second gain element. The second gain element may be the same as the first gain element in at least one embodiment. The second gain element may provide a final gain adjustment. Finally, the second processed signal is transmitted as the output signal.

Figure 4:
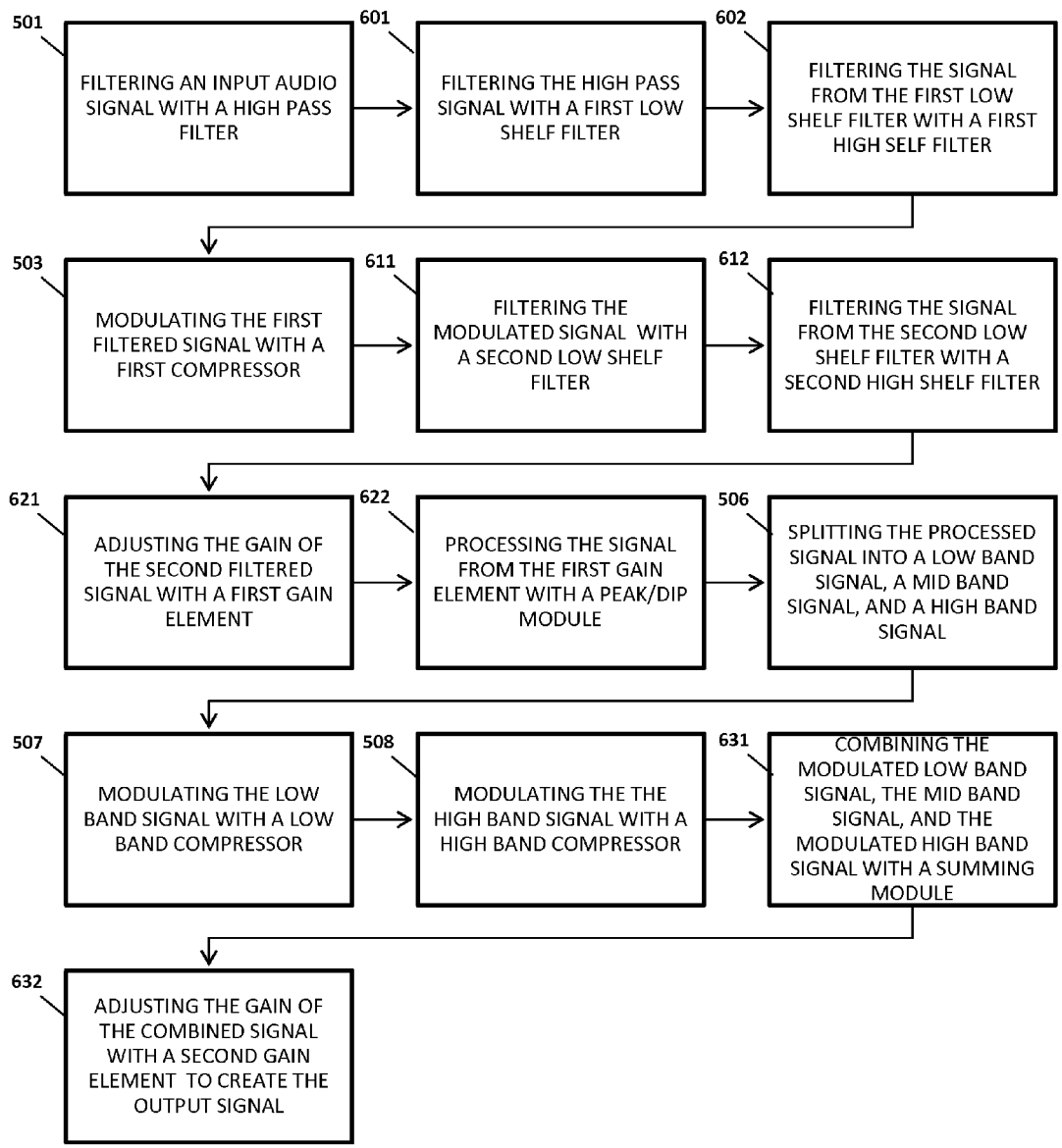
FIG. 4 illustrates a block diagram of another embodiment of the present invention directed to a method for digitally processing an audio signal.

As diagrammatically represented, FIG. 4 illustrates another embodiment directed to a method for digitally processing an audio signal, which may in at least one embodiment incorporate the components or combinations thereof from the systems 100 and/or 300 referenced above. Because the individual components of FIG. 4 have been discussed in detail above, they will not be discussed here. Further, each step of the method in FIG. 4 as detailed below may also be in the form of a code segment directed to at least one embodiment of the present invention, which is stored on a non-transitory computer readable medium, for execution by a computer to process an input audio signal.

Accordingly, an input audio signal is first filtered, as in 501, with a high pass filter. The high pass signal from the high pass filter is then filtered, as in 601, with a first low shelf filter. The signal from the first low shelf filter is then filtered with a first high shelf filter, as in 602. The first filtered signal from the first low shelf filter is then modulated with a first compressor, as in 503. The modulated signal from the first compressor is filtered with a second low shelf filter as in 611. The signal from the low shelf filter is then filtered with a second high shelf filter, as in 612. The second filtered signal from the second low shelf filter is then gain-adjusted with a first gain element, as in 621. The signal from the first gain element is further processed with a peak/dip module, as in 622. The processed signal from the peak/dip module is then split into a low band signal, a mid band signal, and a high band signal, as in 506. The low band signal is modulated with a low band compressor, as in 507. The high band signal is modulated with a high band compressor, as in 508. The modulated low band signal, mid band signal, and modulated high band signal are then combined with a summing module, as in 631. The combined signal is then gain adjusted with a second gain element in order to create the output signal, as in 632.

Any of the above methods may be completed in sequential order in at least one embodiment, though they may be completed in any other order. In at least one embodiment, the above methods may be exclusively performed, but in other embodiments, one or more steps of the methods as described may be skipped.

Figure 5:
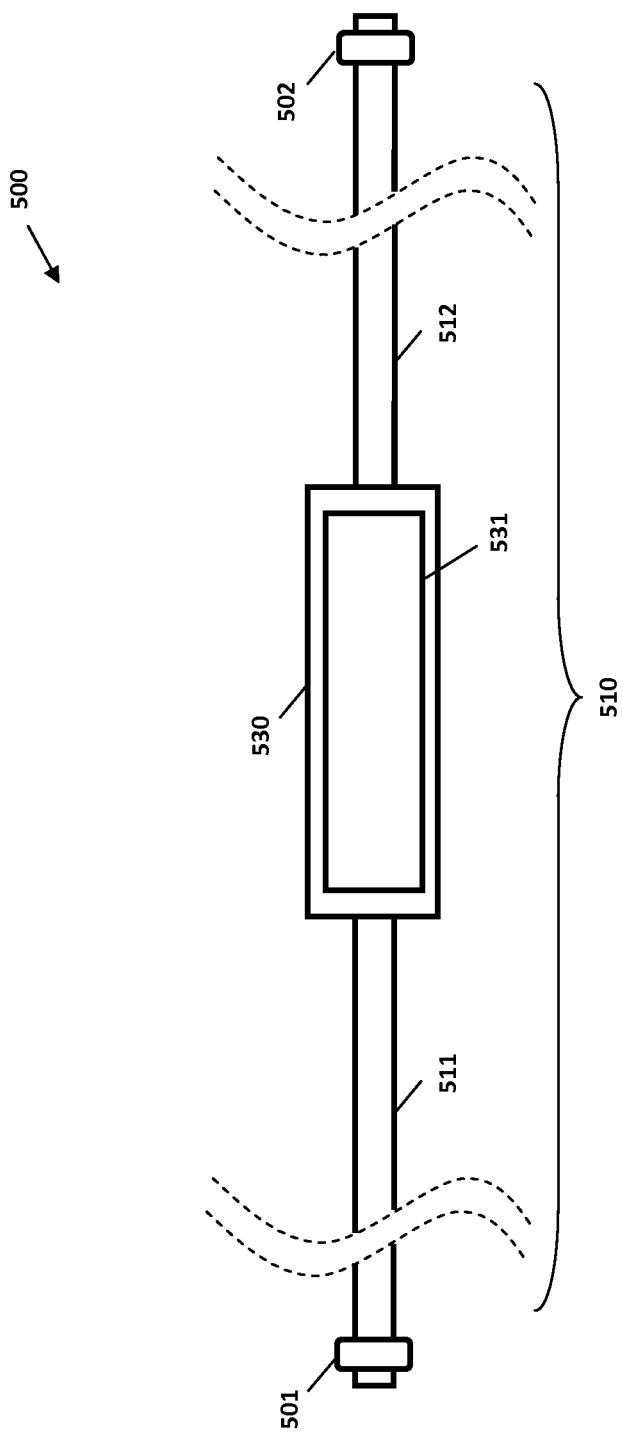
FIG. 5 illustrates a schematic of one embodiment of the present invention directed to an in-line processor.

One further embodiment of the present invention is directed to an in-line processor 500 attached to or embedded within a communications cable 510 as illustrated in FIG. 5. Such a cable comprises an input connector 501, an audio enhancement module 530, and an output connector 502, and some embodiments may also comprise a profile module and/or a user interface 531. In at least one embodiment, the in-line processor 500 comprises a seamless cable 510 housing an audio enhancement module 530 within the cable. In other embodiments, the in-line processor 500 comprises a plurality of cable segments 511, 512 structured to connect the audio enhancement module 530 to the input connector 501 and output connector 502 respectively. In some embodiments, a plurality of input and output connectors may exist along with a plurality of respective cable segments, where the in-line processor 500 may be able to switch between different inputs and/or outputs.

The input and output connectors 501, 502 may be non-standard, or standard, e.g. RCA, component, composite, optical, USB, HDMI, Firewire, headphone connector, or any other connector(s) appropriate for connection with an electronic device in order to transmit a signal. Accordingly, the input connector 501 is structured and/or configured to receive an input signal comprising at least an audio component of a signal, or an audio input signal. The input signal is then processed by the audio enhancement module in order to create an output signal. The output connector 502 is structured and/or configured to transmit the output signal to another electronic device. The in-line processor 500 functions as a communications cable, and for example, may transmit a signal from a DVD player to a television display or from a portable music player to speakers. However, the audio signal that is transmitted through the communications cable is enhanced or processed during transmission by the audio enhancement module 530.

As such, the audio enhancement module 530 may comprise at least one processing component in hardware and/or software structured and/or configured to process an input signal according to a predetermined processing scheme or predetermined audio enhancement scheme, such as the one or more steps and/or components recited above in this application, or the one or more steps and/or components recited in one or more of the applications and patents cross-referenced and incorporated by reference above. For example, in one embodiment, the audio enhancement module 530 may be in the form of a system on a chip or a microcontroller. In another embodiment, the audio enhancement module 530 may be in the form of individual hardware components including filters, compressors, equalizers, and other appropriate signal processing components or electronic circuits.

As such, one embodiment of the present invention may comprise an audio enhancement module comprising a first low shelf filter, a first high shelf filter, a first compressor, a second low shelf filter, a second high shelf filter, a graphic equalizer, and a second compressor. These components and accompanying steps are described in detail in U.S. application Ser. No. 11/947,301 filed on Nov. 29, 2007, which matured into U.S. Pat. No. 8,160,274 on Apr. 17, 2012, incorporated herein by reference in its entirety.

Another embodiment of the present invention may comprise an audio enhancement module comprising a high pass filter, a first low shelf filter, a first high shelf filter, a first compressor, a second low shelf filter, a second high shelf filter, a first processing module, a band splitter, a low band compressor, a high band compressor, and a second processing module. These components and accompanying steps are described in detail above in this patent.

Figure 6:
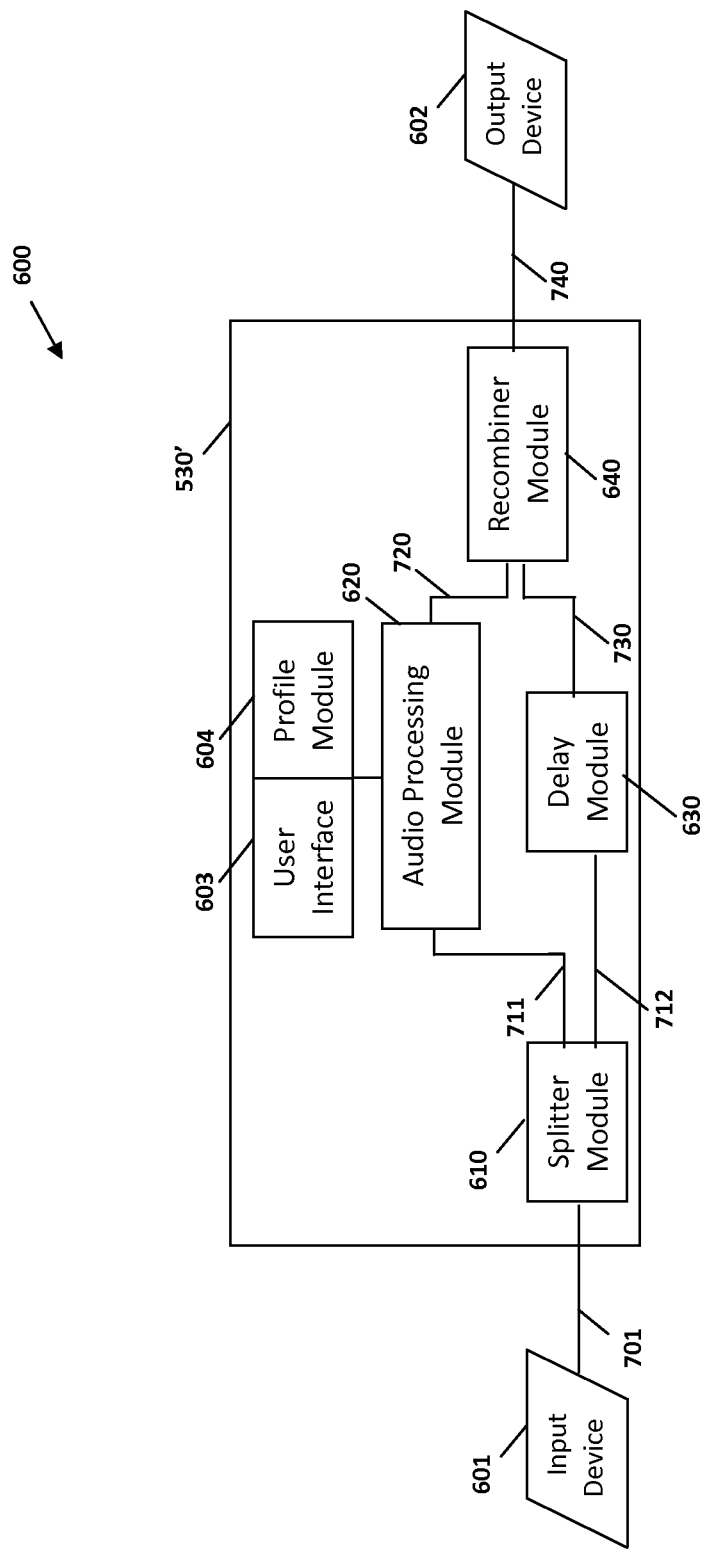
FIG. 6 illustrates a schematic of another embodiment of the present invention directed to an in-line processor.

As illustrated in FIG. 6, one embodiment of the present invention comprises an audio enhancement module 530'. As such, an input signal 701 is received from an input device 601. If applicable, a splitter module 610 splits the input signal into an audio signal 711 and a video or other signal 712. The audio signal 711 is processed by the audio processing module 620, whereas the video or other signal 712 is delayed via a delay module to keep the signals in sync. After processing, a processed audio signal 720 is recombined with the delayed video signal 730 via a recombiner module 640, which comprises appropriate software and/or hardware circuitry to create the output signal 740 to be transmitted to the output device 602.

In at least one embodiment of the present invention, a profile module 604 may be used to select from one or more predetermined audio enhancement scheme(s) and/or adjust the parameters thereof. These parameters may include but are not limited to frequency cutoffs, gain adjustments, filter adjustments, adjusting the equalizing coefficients of a graphic equalizer, other adjustments as disclosed in the earlier applications and patents incorporated herein by reference, and/or any other adjustments known to those skilled in the art and is/are appropriate for the enhancement of an audio signal.

In at least one embodiment, preset profiles or processing profiles may be directed to particular hardware and/or audio environments. A user may be able to select processing profiles, audio enhancement scheme(s) and/or adjust any parameters via a user interface 603. The user interface 603 may comprise a touchscreen or button interface on the audio enhancement module 530'. Alternatively, the user interface 603 may comprise a wired or wireless connection to another device in communication with the audio enhancement module 530'. For example, a user may utilize near-field communication such as Bluetooth, infrared, or WiFi to access the profile module 604 and select a profile or otherwise alter or customize any parameters of the audio enhancement module 530'.

Since many modifications, variations and changes in detail can be made to the described preferred embodiment of the invention, it is intended that all matters in the foregoing description and shown in the accompanying drawings be interpreted as illustrative and not in a limiting sense. Thus, the scope of the invention should be determined by the appended claims and their legal equivalents.

Now that the invention has been described,

What is claimed is:

1. A communications cable for processing an input signal comprising:
   an input connector structured to receive the input signal;
   an audio enhancement module configured to process the input signal in order to create an output signal, said audio enhancement module comprising:
   a first low shelf filter configured to filter the input signal;
   a first high shelf filter configured to filter the signal received from said first low shelf filter;
   a first compressor configured to compress the filtered signal from said first high shelf filter;
   a second low shelf filter configured to filter the first compressed signal from said first compressor;
   a second high shelf filter configured to filter the signal received from said second low shelf filter;
   a graphic equalizer configured to process the filtered signal from said second high shelf filter; and
   a second compressor configured to compress the processed signal from said graphic equalizer;
   an output connector structured to transmit the output signal.

2. A communications cable of claim 1 further comprising a profile module in communication with said audio enhancement module, said profile module comprises a plurality of processing profiles each configured to adjust at least one parameter of the audio enhancement module.

3. A communications cable of claim 2 further comprising a user interface operatively configured to allow a user to select any one of the plurality of processing profiles on the profile module.

4. A communications cable of claim 3 wherein said at least one of said plurality of processing profiles is customizable via said user interface.

5. A communications cable for processing an input signal comprising:
   an input connector structured to receive the input signal;
   an audio enhancement module configured to process the input signal, said audio enhancement module comprising:
   a high pass filter configured to filter the input audio signal to create a high pass signal,
   a first low shelf filter configured to filter the high pass signal to create a first low shelf signal,
   a first high shelf filter configured to filter the first low shelf signal to create a first filtered signal,
   a first compressor configured to modulate the first filtered signal to create a modulated signal,
   a second low shelf filter configured to filter the modulated signal to create a second low shelf signal,
   a second high shelf filter configured to filter second low shelf signal to create a second filtered signal,
   a first processing module configured to process second filtered signal to create a processed signal,
   a band splitter configured to split the processed signal into a low band signal, a mid band signal, and a high band signal,
   a low band compressor configured to modulate the low band signal to create a modulated low band signal,
   a high band compressor configured to modulate the high band signal to create a modulated high band signal, and
   a second processing module configured to process the modulated low band signal, the mid band signal, and the modulated high band signal to create an output signal;
   an output connector structured to transmit the output signal.

6. A communications cable of claim 5 wherein said first processing module comprises a peak/dip module configured to process the second filtered signal to create the processed signal.

7. A communications cable of claim 5 wherein said first processing module comprises:
   a first gain element configured to adjust the gain of the second filtered signal to create a first gain signal,
   a peak/dip module configured to process the first gain signal to create the processed signal.

8. A communications cable of claim 5 wherein said second processing module comprises a summing module configured to combine the modulated low band signal, the mid band signal, and the modulated high band signal to create the output signal.

9. A system as recited in claim 8 wherein said summing module is further configured to selectively adjust the individual gains of each of the received modulated low band signal, mid signal, and modulated high band signals.

10. A communications cable of claim 5 wherein said second processing module comprises:
   a summing module configured to combine the modulated low band signal, the mid band signal, and the modulated high band signal to create a combined signal,
   a second gain element configured to adjust the gain of the combined signal to create the output signal.

11. A communications cable of claim 5 further comprising a profile module in communication with said audio enhancement module, wherein said profile module comprises a plurality of processing profiles each configured to adjust at least one parameter of the audio enhancement module.

12. A communications cable of claim 11 further comprising a user interface operatively configured to allow a user to select any one of the plurality of processing profiles on the profile module.

* * * * *